(12) United States Patent
Bakalski

(10) Patent No.: US 7,414,465 B2
(45) Date of Patent: Aug. 19, 2008

(54) AMPLIFIER ARRANGEMENT

(75) Inventor: Winfried Bakalski, München (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 11/413,433

(22) Filed: Apr. 28, 2006

(65) Prior Publication Data
US 2006/0261888 A1 Nov. 23, 2006

(30) Foreign Application Priority Data
May 2, 2005 (DE) .................. 10 2005 020 319

(51) Int. Cl.
*H03F 1/14* (2006.01)
(52) U.S. Cl. ........................ 330/51; 330/295
(58) Field of Classification Search .............. 330/51, 330/295, 124 R, 84
See application file for complete search history.

(56) References Cited

U.S. PATENT DOCUMENTS

| | | | |
|---|---|---|---|
| 6,181,206 B1 | 1/2001 | Palmisano et al. | |
| 6,342,813 B1 | 1/2002 | Imbornone et al. | |
| 6,674,329 B1 * | 1/2004 | Stengel et al. | 330/286 |
| 7,009,454 B2 * | 3/2006 | Rategh et al. | 330/295 |
| 7,123,096 B2 * | 10/2006 | Selin | 330/295 |

OTHER PUBLICATIONS

"RF Power Amplifiers for Multi-Standard Tranceivers" Philips, A. Van Bezooijen, ESSCIRC 2003 Workshop, High Performance Wireless Tranceiver Design, 24 pgs.

* cited by examiner

*Primary Examiner*—Henry K Choe
(74) *Attorney, Agent, or Firm*—Eschweiler & Associates, LLC

(57) ABSTRACT

An amplifier arrangement has a first transistor and at least one further transistor. The amplifier arrangement furthermore includes a first coupling impedance, which couples a first supply voltage terminal of the amplifier arrangement to a second terminal of the first transistor, and at least one further coupling impedance, which couples the first supply voltage terminal to a second terminal of the at least one further transistor. The first coupling impedance has a coil and the at least one further coupling impedance includes a partial coil of the coil.

23 Claims, 7 Drawing Sheets

AMPLIFIER ARRANGEMENT

REFERENCE TO RELATED APPLICATIONS

This application claims the benefit of the priority date of German application DE 10 2005 020 319.1, filed on May 2, 2005, the contents of which are herein incorporated by reference in their entirety.

FIELD OF THE INVENTION

The present invention relates to the field of electronics, and primarily to an amplifier arrangement and a method for amplifying a signal to be amplified with a gain factor that can be changed over.

BACKGROUND OF THE INVENTION

Amplifier arrangements serve for amplifying electrical signals in order, by way of example, to make audio and speech signals audible by means of a loudspeaker. In the area of mobile communication, amplifier arrangements serve for amplifying a signal to an extent such that sufficient field strength can be obtained with an antenna. In Global System for Mobile Communication mobile telephones, abbreviated to GSM mobile telephones, there are a plurality of types of modulation. One modulation method is the Gaussian minimum shift keying method, abbreviated to GMSK method, and another is a quadrature amplification module method, abbreviated to 8-PSK, with enhanced data rate for GSM evolution, abbreviated to EDGE. In the 900 megahertz transmission path, the power amplifier is in both cases fed with an input power of approximately 2 dBm on the input side. The power amplifier is operated in saturation in the case of the GMSK method and in the linear region in the case of the 8-PSK EDGE method. There are also amplifier arrangements that operate at 5 gigahertz.

An amplifier arrangement should be suitable for production in large numbers and have a gain factor that can be changed over.

BRIEF SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, an amplifier arrangement comprises a first transistor having a first, a second and a third terminal; at least one further transistor having a first, a second and a third terminal; a first coupling impedance, which comprises a coil and couples a first supply voltage terminal of the amplifier arrangement to the second terminal of the first transistor; at least one further coupling impedance, which comprises a partial coil of the coil and couples the first supply voltage terminal to the second terminal of the at least one further transistor; an input terminal of the amplifier arrangement, said input terminal being coupled to the first terminal of the first transistor and the first terminal of the at least one further transistor; a common output node coupled to a second supply voltage terminal of the amplifier arrangement, an output terminal of the amplifier arrangement and the third terminals; an activation/deactivation mechanism or unit, which comprises at least one selection input and is coupled to the first terminals.

In another embodiment, an amplifier arrangement comprises a first transistor; at least one further transistor; a first coupling impedance, which comprises a coil and couples a first supply voltage terminal of the amplifier arrangement to a terminal of the first transistor; at least one further coupling impedance, which in each case comprises a partial coil of the coil and which couples the first supply voltage terminal to a respective terminal of the at least one further transistor; an input terminal of the amplifier arrangement, said input terminal being coupled to the first transistor and the at least one further transistor on the input side; a second supply voltage terminal of the amplifier arrangement, said second supply voltage terminal being coupled to output-side terminals of the first and at least one further transistor; and an output terminal of the amplifier arrangement, said output terminal being coupled to the output-side terminals.

In one embodiment, a power amplifier is provided, having a first and at least one further amplifier, which are connected, on the input side, to a coupling-in element for feeding in a signal to be amplified and to an activation/deactivation unit, which are coupled to a first supply voltage terminal via a coupler, comprising a series circuit formed by a first and at least one further inductance, and which are connected, on the output side, to a coupling-out element for providing an amplified signal.

In another embodiment, a method for amplifying a signal to be amplified with a gain factor that can be changed over is provided, comprising feeding in a signal to be amplified; feeding in at least one control signal for predefining the gain factor from a set comprising a first and at least one further gain factor; optionally amplifying the signal to be amplified with the first gain factor by means of a first transistor whilst utilizing a negative feedback with a first coupling impedance; optionally amplifying the signal to be amplified with the at least one further gain factor by means of at least one further transistor whilst utilizing a negative feedback with at least one further coupling impedance, the inductance value of which differs from the inductance value of the first coupling impedance, and the first and the second coupling impedance comprise a common partial inductance; providing an amplified signal.

In another embodiment, a method for amplifying a signal to be amplified is provided, comprising feeding in a signal to be amplified; feeding in a first and at least one further control signal; defining an operating point of a first transistor by applying a first control signal to a first selection input and by means of a first selection impedance arranged between the first selection input and a first terminal of the first transistor, and amplifying the signal to be amplified by means of the first transistor whilst utilizing a negative feedback with a first coupling impedance with an inductive component; defining an operating point of at least one further transistor by applying at least one further control signal to at least one further selection input and by means of at least one further selection impedance arranged between the at least one further selection input and a first terminal of the at least one further transistor, and amplifying the signal to be amplified by means of the at least one further transistor whilst utilizing a negative feedback with at least one further coupling impedance with an inductive component, the first coupling impedance and the at least one further coupling impedance each being an impedance from a common impedance network; providing an amplified signal.

In another embodiment, a method for changing over the gain is provided, comprising feeding in a signal to be amplified; changing over between a first transistor and at least one further transistor in a manner dependent on a desired gain by altering the inductive negative feedback; in which the inductive negative feedback of one transistor partly comprises the inductive negative feedback of another transistor.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE INDIVIDUAL DRAWINGS

The invention is explained in more detail below using a plurality of exemplary embodiments with reference to the figures.

Figure 4:
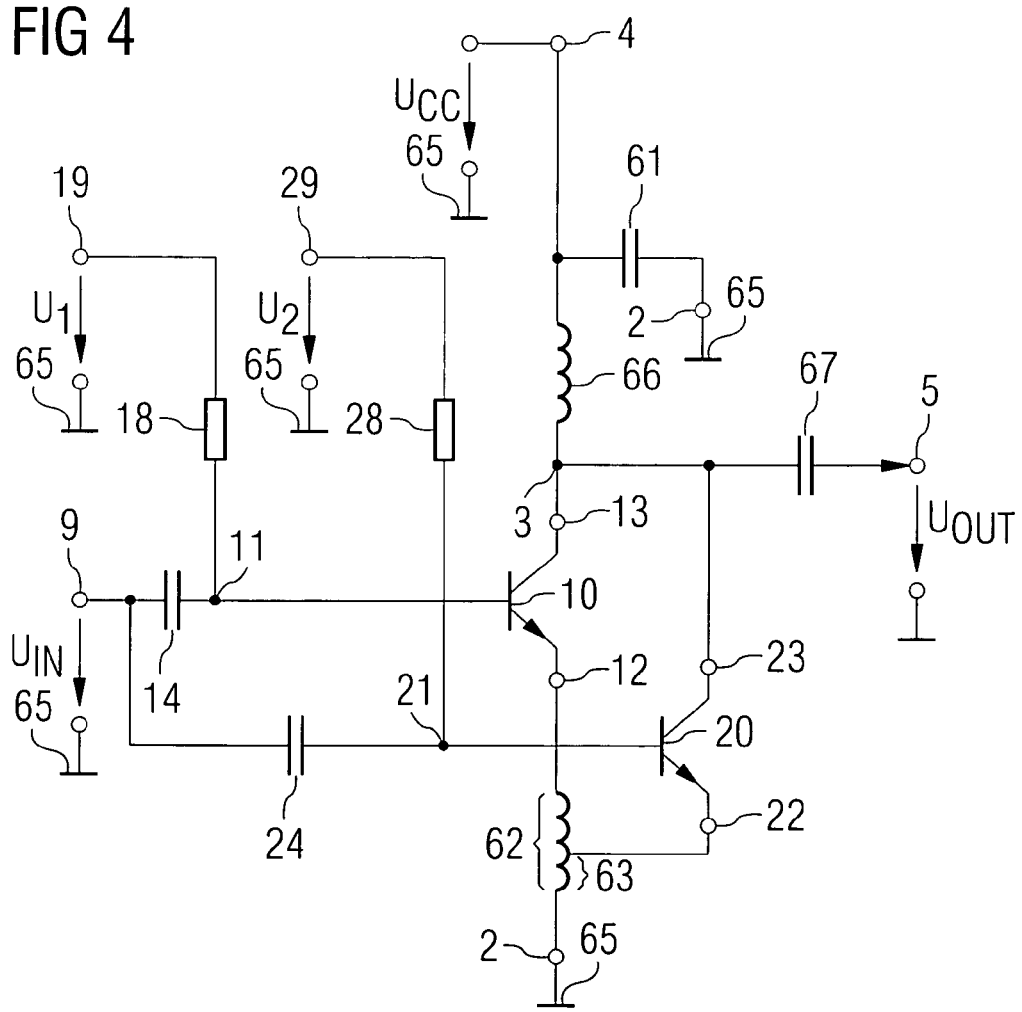
FIG. 4 shows an exemplary embodiment of an amplifier arrangement in a development of the amplifier arrangement of FIG. 1 or FIG. 2 with a first and a further transistor.

FIGS. 6 A to D show simulation results of an exemplary amplifier arrangement in accordance with FIG. 4.

Figure 7:
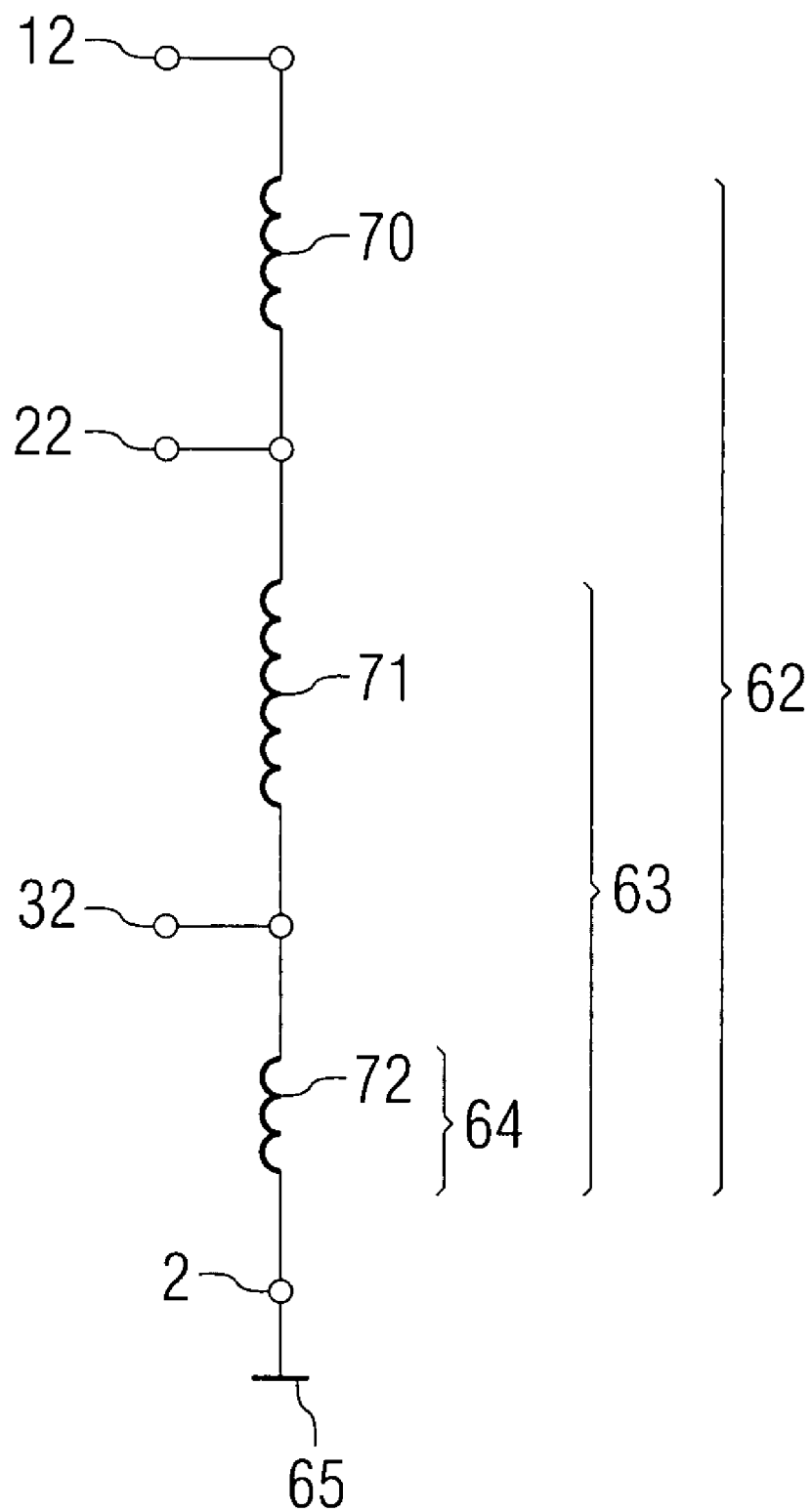

FIG. 7 shows a further exemplary embodiment of a coil.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Figure 1:
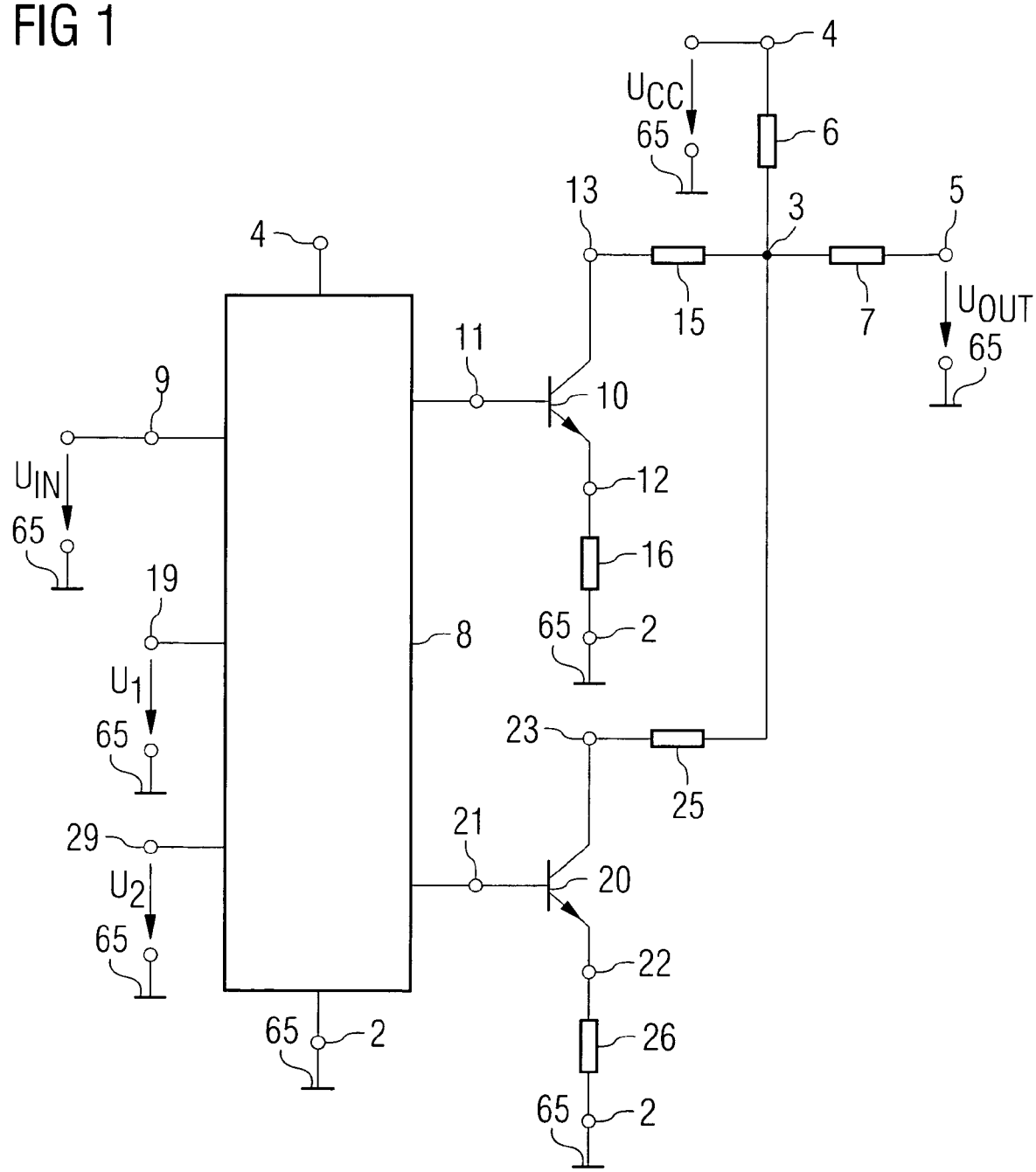
FIG. 1 shows an example amplifier arrangement according to the principle proposed.

FIG. 1 shows an example amplifier arrangement according to the principle proposed. It shows a first and a second transistor 10, 20. The transistors 10, 20 are embodied as bipolar transistors.

A first terminal 11 of the first transistor 10 is formed by a base of the transistor 10. A first terminal 21 of the second transistor 20 is analogously formed by a base of the second transistor 20.

An emitter of the first transistor 10 forms a second terminal 12 of the first transistor 10. The second terminal 12 is coupled to a first supply voltage terminal 2 via a coupling impedance 16. An emitter of the second transmitter 20 analogously forms a second terminal 22 of the second transistor 20. The second terminal 22 of the second transistor 20 is connected to the first supply voltage terminal 2 via a coupling impedance 26.

A collector of the first transistor 10 forms a third terminal 13 of the first transistor 10. This terminal is connected to an output node 3 of the amplifier arrangement via a first transistor load impedance 15. A collector of the second transistor 20 analogously forms a third terminal 23 of the second transistor 20. The third terminal 23 of the second transistor 20 is connected to the output node 3 by means of a second transistor load impedance 25.

The output node 3 is linked to the output terminal 5 of the amplifier arrangement by means of an output terminal impedance 7.

The output node 3 is linked to a second supply voltage terminal 4 by means of a load impedance 6. The potential of the second supply voltage terminal 4 differs from the potential of the first supply voltage terminal 2 by a voltage $U_{CC}$, which is a positive voltage in this example embodiment. The first supply voltage terminal 2 is connected to a reference potential 65 in this example embodiment.

A mechanism or unit for activation/deactivation 8 couples an input terminal 9 and also a first selection input 19 and a second selection input 29 of the amplifier arrangement to the first terminals 11, 21 of the transistors 10, 20. Via the first selection input 19, the means for activation/deactivation 8 receives a control signal $U_1$ for activating the first and second transistors 10, 20, respectively.

The control signal $U_1$ may be a digital signal. By way of example, a digital signal having the value 1 may mean that the first transistor 10 is activated and the second transistor 20 is deactivated. A digital signal having the value 0 in this case means that the first transistor 10 is deactivated and the second transistor 20 is activated. In this case, a binary control signal $U_1$ and the first selection input 19 suffice for setting which of the two transistors 10, 20 is activated.

Via the first and the second selection input 19, the means for activation/deactivation 8 may also receive two control signals $U_1$, $U_2$ and also be designed, besides the two operating settings mentioned, for deactivating both transistors 10, 20 and/or for activating both transistors 10, 20. If both transistors 10, 20 are deactivated, then the amplifier arrangement is switched off. If both transistors 10, 20 are activated, this results in a gain factor which is higher than in the case of only one activated transistor 10, 20.

In this example embodiment, the mechanism or means for activation/deactivation 8 is connected to the first and the second supply voltage terminal 2, 4. Consequently, the means 8 may comprise a logic circuit and an analog circuit, which is supplied with a supply voltage $U_{CC}$. The mechanism 8 generates a voltage from the control signal or the control signals $U_1$, $U_2$, which voltage is output to the first terminal 11 of the first transistor 10. In the case of a control signal $U_1$, $U_2$ which signals that the amplifier arrangement is to be set to the gain factor provided by the transistor 10, said voltage holds the first transistor 10 at an operating point of a transistor characteristic curve for activated operation, so that it amplifies a signal $U_{IN}$ to be amplified. In the case of a control signal $U_1$, $U_2$ which signals that the amplifier arrangement is to be set to a different gain factor than that provided by the transistor 10, the mechanism 8 has to generate a voltage which holds the first transistor 10 in a turned-off state. The analog circuit may comprise a circuit for level conversion.

A control signal $U_1$, $U_2$ present at the first and second selection inputs 19, 29 may already have a voltage which is sufficient for turning on or turning off the first transistor.

In the case where the first selection input 19 is assigned to the first transistor 10 and the second selection input 29 is assigned to the second transistor 20, the mechanism 8 can be designed more simply because it is not necessary to provide a logic circuit in the mechanism 8.

The collector currents through the two transistors 10, 20 are cumulated at the output node 3. By suitably connecting up the load impedance 6 connected between the output node 3 and the second supply voltage terminal 4, and the output terminal impedance 7 connected between the node 3 and the output terminal 5 of the amplifier arrangement, what is achieved is that a DC current which flows through the load impedance 6 is equal to the DC current which flows through the third terminals 13, 23, that is to say the collectors of the two transistors 10, 20. By contrast, the collector current of the two transistors 10, 20, which contains the AC component and thus represents the result of the amplification of the signal $U_{IN}$ to be amplified, flows via the output terminal impedance 7, which is as small as possible in the case of AC voltages, to the output terminal 5.

The load impedance 6 is, in one example, a resistance or an inductance or a combination of resistance and inductance.

In accordance with the control signals $U_1$, $U_2$, the first and/or the second transistor 10, 20 may optionally be switched on, so that the signal $U_{IN}$ to be amplified is amplified with different gain factors.

Figure 2:
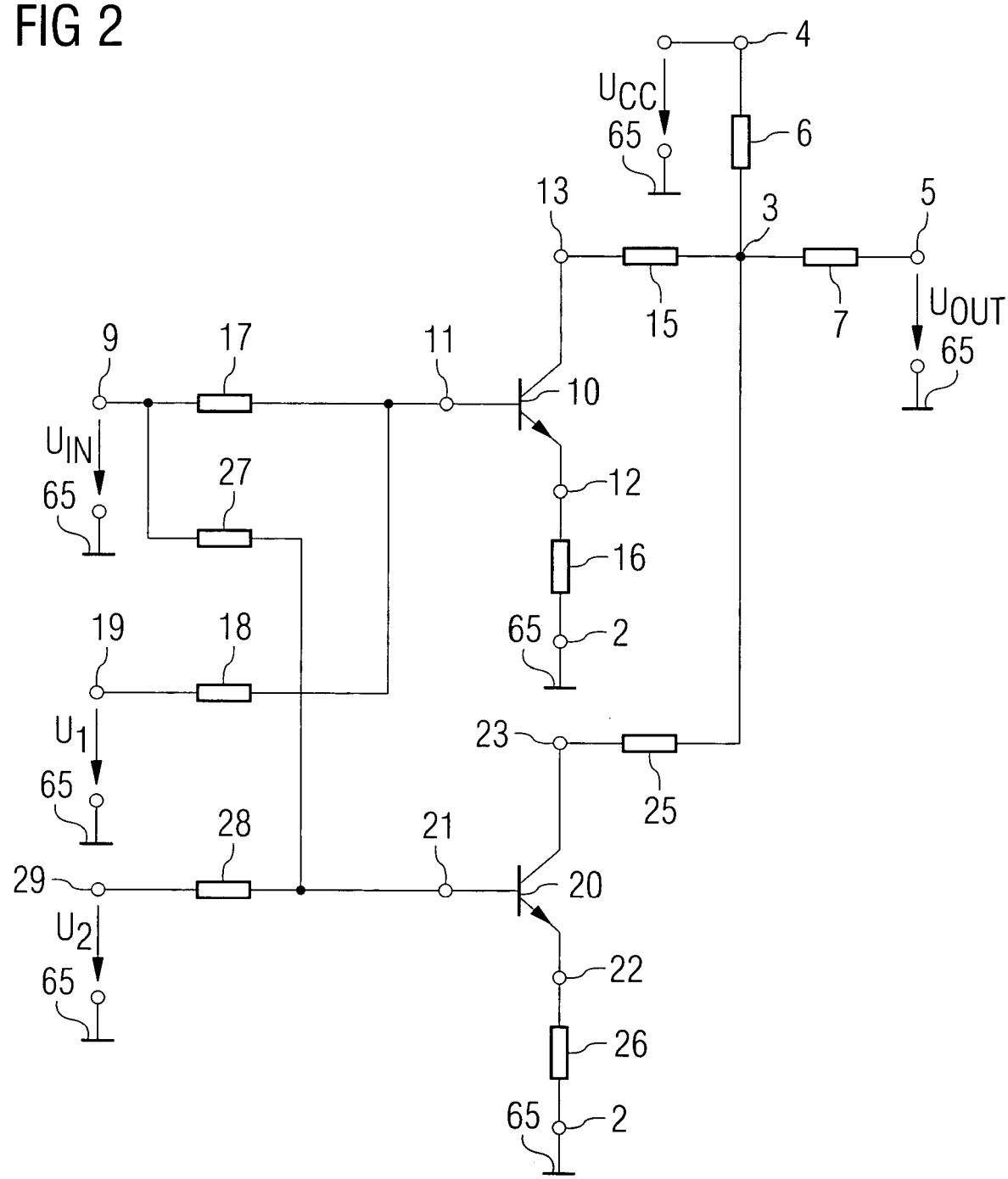
FIG. 2 shows a development of the amplifier arrangement of FIG. 1 with an exemplary mechanism for activation/deactivation.

FIG. 2 shows a development of the amplifier arrangement of FIG. 1. Insofar as the two amplifier arrangements correspond in terms of structural parts, interconnection and function, the description thereof is not repeated at this juncture.

FIG. 2 additionally has an example design of the mechanism for activation/deactivation 8. In FIG. 2, the input terminal 9 is connected to the first terminal 11 of the transistor 10 via a first input impedance 17, and the input terminal 9 is likewise connected to the first terminal 21 of the second transistor 20 via a second input impedance 27.

In FIG. 2, the first selection input 19 is linked to the first input 11 of the first transistor 10 by means of a first selection impedance 18. Consequently, the currents through the first input impedance 17 and the first selection impedance 18 are cumulated at the first terminal 11 of the first transistor 10. Analogously to this, the further selection input 29 is linked to the first terminal 21 of the second transistor 20 by means of the further selection impedance 28.

By applying a voltage to the first selection input 19, the first transistor 10 is activated, that is to say brought to a switched-on operating state.

Said voltage is can be a DC voltage, so that a base current of the transistor 10 exhibits a DC component that holds it at an operating point of the family of characteristic curves so that it is activated. If said voltage is approximately at the potential level of the first supply voltage terminal 2, then the first transistor 10 is switched off. The selection impedance 18 can thus be a resistor or a coil or a combination of resistors and coils, so that the DC component of the base current can be designed in a simple manner.

Analogously, by applying a voltage to the second selection input 29, the second transistor 20 is activated, that is to say brought to an amplifying operating state. The same analogously holds true for circuitry connections, a base current and a functioning of the second transistor 20.

By applying the signal $U_{IN}$ to be amplified at the input terminal 9, the signal $U_{IN}$ to be amplified is fed to the two transistors, but is amplified only at the transistor which is in an active state.

It is noted that the first or second transistor 10, 12 can be especially designed with regard to the corresponding amplifier task. This arrangement of FIG. 2 allows activation of the first or second transistor 10, 12 by the choice of suitable potentials at the first and the second selection input 19, 29.

Figure 3:
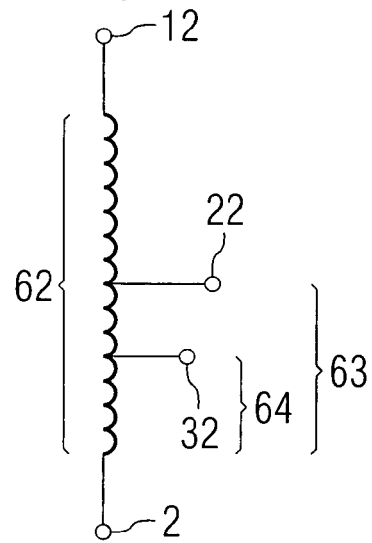
FIG. 3 shows an exemplary coupling impedance for application in the amplifier arrangement and in FIG. 1 or 2.

FIG. 3 shows an example coupling impedance such as may be used in FIGS. 1, 2, 4 and/or 5. In this example embodiment, the first coupling impedance 16 in FIGS. 1, 2, 4 and/or 5, which is situated between the second terminal 12 of the first transistor 10 and the first supply voltage terminal 2 in FIGS. 1, 2, 4 and/or 5, is formed by a coil 62.

A winding tap makes it possible for the second coupling impedance 26 in FIGS. 1, 2, 4 and/or 5, which is situated between the second terminal 22 of the second transistor 20 and the first supply voltage terminal 2 in FIGS. 1, 2, 4 and/or 5, to be formed by the partial coil 63 between the winding tap and the first supply voltage terminal 2.

In this case, the winding tap to which the second terminal 22 of the second transistor 20 is connected may be in the center of the coil winding. However, in order to obtain a specific ratio of the gain factors, it is also possible for the winding tap to be realized at a location of the coil between the second terminal 12 of the first transistor and the first supply voltage terminal 2 which is not the center of the coil winding.

Figure 5:
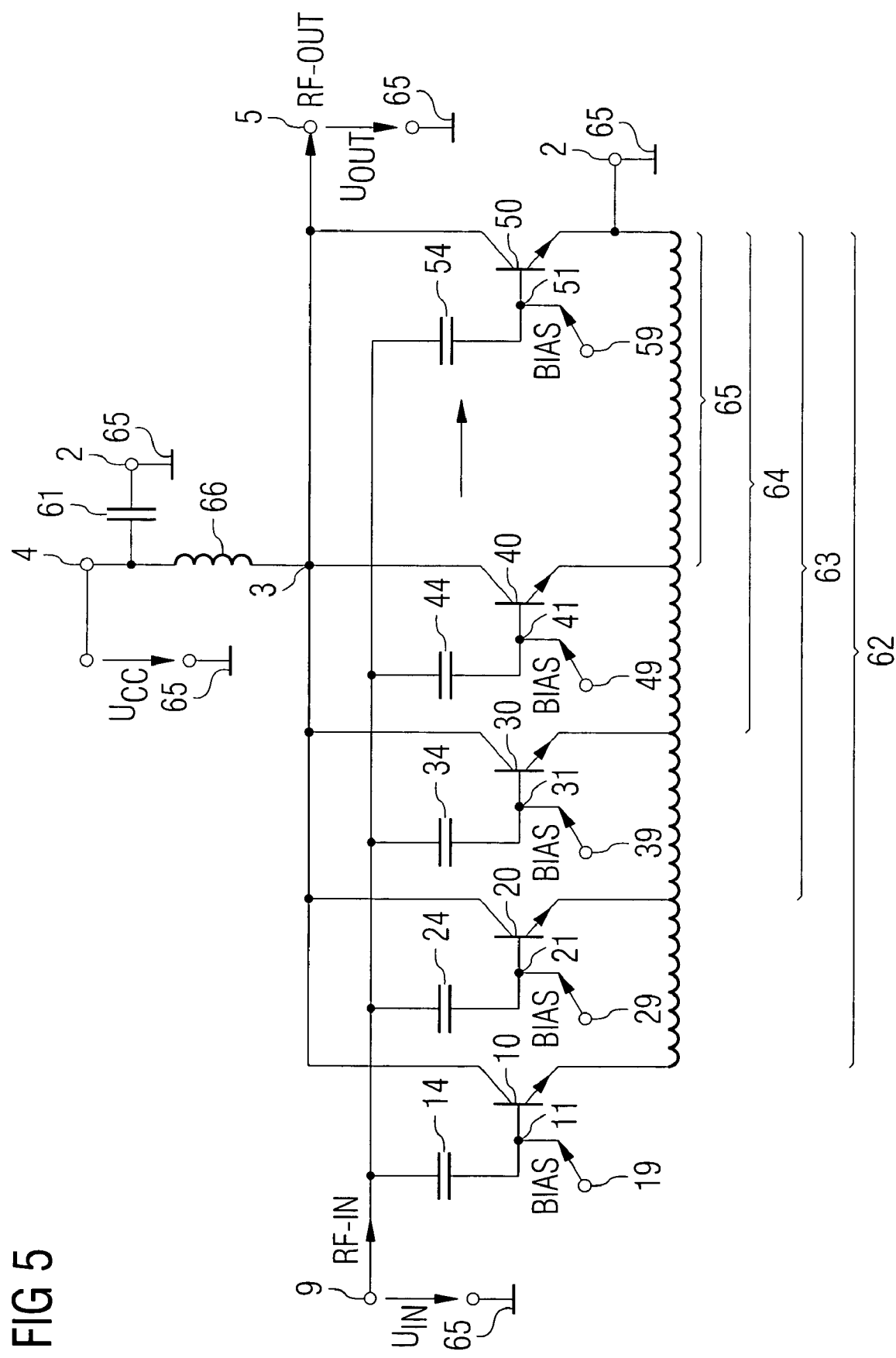
FIG. 5 shows an exemplary amplifier arrangement with five transistors in a development of the amplifier arrangement of FIG. 1, FIG. 2 or FIG. 4.
Figure 6A:
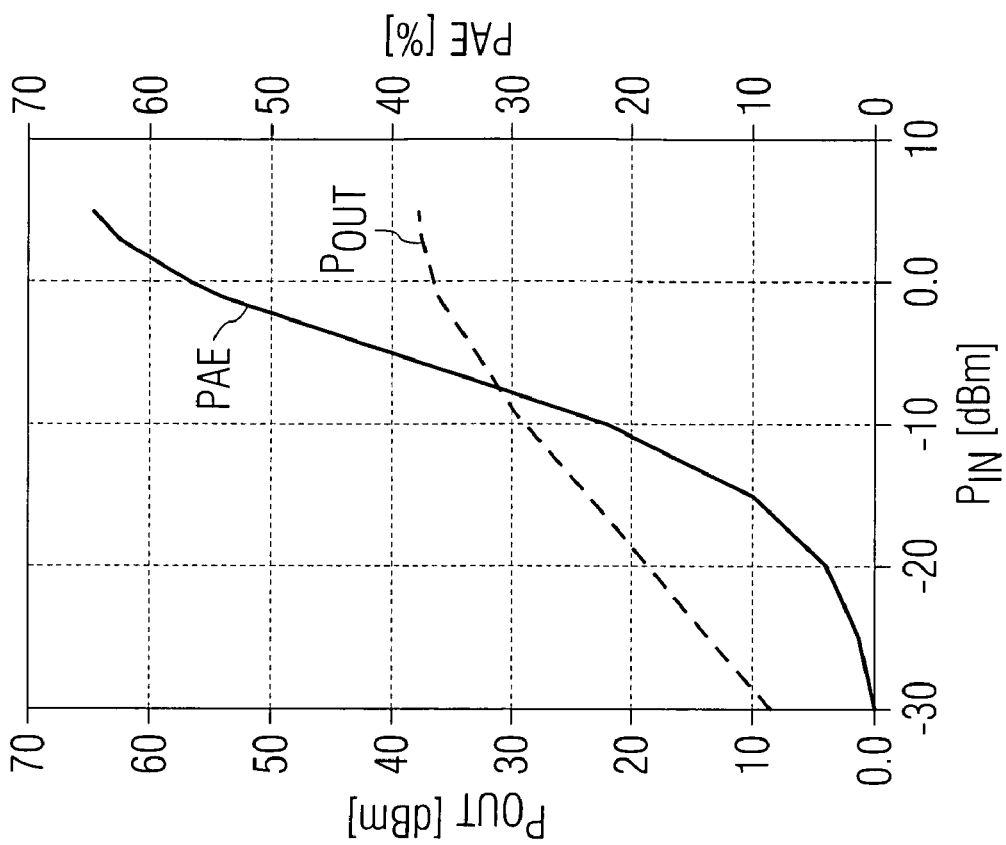
Figure 6B:
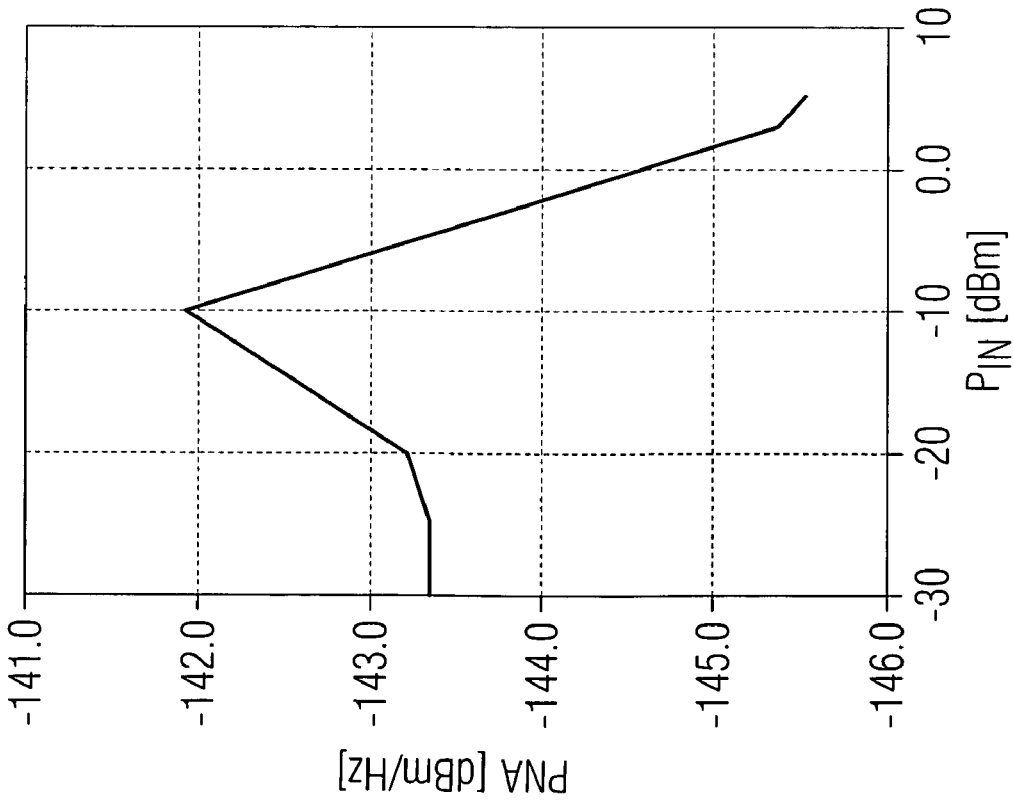
Figure 6D:
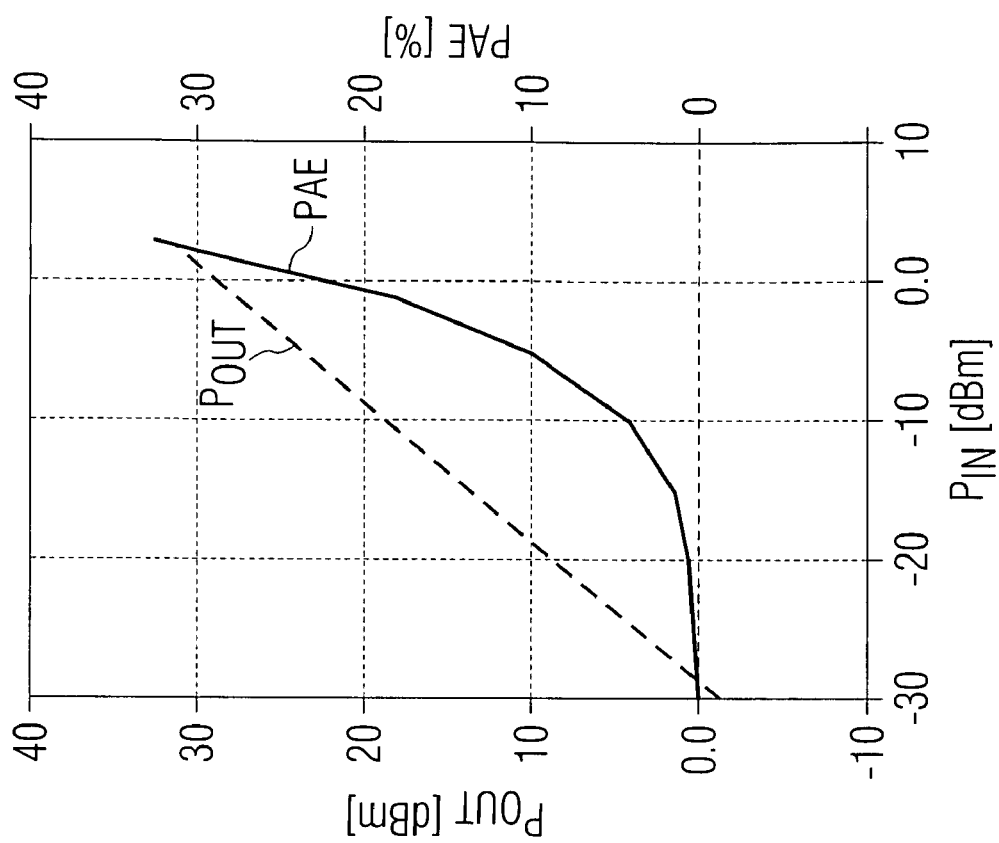
Figure 6C:
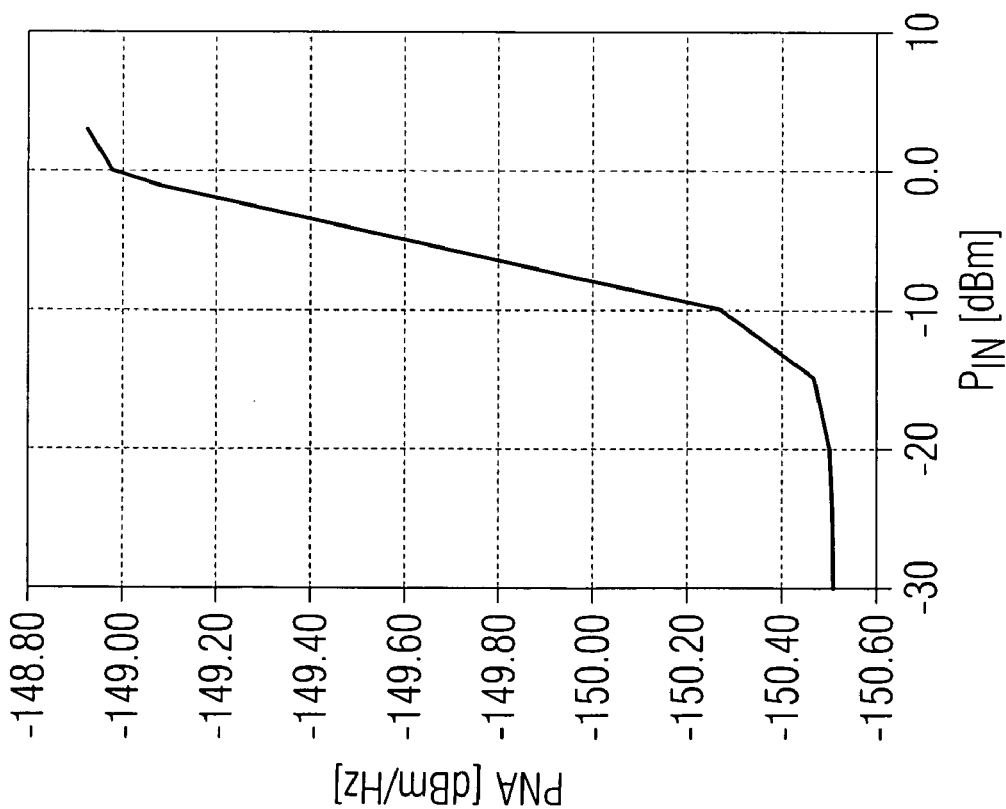

A second terminal 32 of a further transistor 30 in FIG. 4 and/or FIG. 5 may be connected at a further winding tap, said transistor thus having a partial coil 64 as a further coupling impedance 36. The partial coil 64 has a winding tap asymmetrically and thus outside the center of the coil winding.

In one example, a single coil is used wholly or in parts for forming the first and at least one further coupling impedance. The first transistor 10 thus experiences the largest current negative feedback in the region of the voltages to be amplified, since the first coupling impedance 16 has larger values than the further coupling impedances 26, 36. The first transistor 10 therefore has a smaller gain factor than the transistors 20 or 30.

FIG. 4 shows an example embodiment of an amplifier arrangement with a first and a further transistor 10, 20. It shows a development of the amplifier arrangement of FIG. 1 and FIG. 2 and shows the first and the further coupling impedance 16, 26 in the embodiment in accordance with FIG. 3. Insofar as the two amplifier arrangements correspond in terms of structural parts, interconnection and function, the description thereof is not repeated at this junction. The two control signals $U_1$, $U_2$ for activation and deactivation are applied to the first and the further selection input 19, 29. The first and the second input impedance 16, 26 are embodied as a first and a second input capacitor 14, 24 in this example embodiment. The signal $U_{IN}$ to be amplified is fed to the first terminal 11 of the first transistor 10 via the input terminal 9 of the amplifier arrangement and by means of the first input capacitor 14. By means of the second input capacitor 24, the signal $U_{IN}$ to be amplified is analogously fed to the first terminal 21 of the second transistor 20.

The third terminals 13, 23 of the first and of the second transistor 10, 20 are directly connected to the output node 3. The first and the second transistor load impedance 15, 25 are thus replaced by a line.

In this embodiment, the load impedance 6 is embodied as a load coil 66. The output node 3 is linked to the second supply voltage terminal 4 via the load coil 66. An overcoupling of radio frequency signals to the second supply voltage terminal 4 is thus avoided.

In this example embodiment, the potential of the supply voltage terminal 4 is smoothed by means of a smoothing impedance 61, which may be a capacitor for example, a first capacitor electrode being connected to the first supply voltage terminal 2 and a second capacitor electrode being connected to the second supply voltage terminal 4.

In this example embodiment, the output terminal impedance 7 is embodied as an output capacitor 67. The output capacitor 67 connects the output node 3 to the output terminal 5.

As already explained with reference to FIG. 3, the first coupling impedance 16 of the first transistor 10 is formed as the coil 62 between the second terminal 12 of the first transistor and the first supply voltage terminal 2. The further coupling impedance 26 of the second transistor 20 is analogously formed by a partial coil 63 between the winding tap of the coil and the first supply voltage terminal 2. The coupling impedances 62 and 63 therefore differ significantly. For this reason, it is possible to realize different gain factors by selection of the first or of the second transistor 10, 20.

This amplifier arrangement manages only with transistors of one integration technology such as MOS technology or bipolar technology, for instance, and, as shown in this embodiment, only very few components may be sufficient for realization.

FIG. 5 shows an example amplifier arrangement with five transistors 10, 20, 30, 40, 50. FIG. 5 shows a development of the amplifier arrangement of FIG. 1 and FIG. 2 and of the coupling impedance in accordance with FIG. 3. Insofar as the amplifier arrangements correspond in terms of structural parts, interconnection and function, the description thereof is not repeated at this juncture.

In this schematic circuit diagram, the signal $U_{in}$ to be amplified, which may also be designated as incoming radio frequency signal RF-in, is applied to the input terminal 9.

In this example embodiment, the first and the further input impedance 17, 27, 37, 47, 57 are designed as input capacitors 14, 24, 34, 44, 54, via which the signal $U_{in}$ to be amplified can be applied to the first terminals 11, 21, 31, 41, 51 of the transistors 10, 20, 30, 40, 50. A BIAS potential is applied to the first terminals 11, 21, 31, 41, 51 of the first and of the further transistors 10, 20, 30, 40, 50 by means of the first and the further selection inputs 19, 29, 39, 49, 59.

The output terminal impedance 7 is formed by a line. The amplified signal $U_{OUT}$ passes to the output node 3, which in this example embodiment is connected by a line to the AC voltage output 5 for the signal $U_{IN}$ to be amplified.

The load impedance 6 is formed by a load coil 66. The output node 3 is thus connected to the second supply voltage terminal 4 by means of the load coil 66. The potential of the second supply voltage terminal 4 differs from the potential of the first supply voltage terminal 2 by the voltage $U_{CC}$, the voltage $U_{CC}$ being positive in this example embodiment. The voltage $U_{CC}$ is smoothed by the smoothing impedance 61, a capacitor in this example.

The coupling impedances for all five transistors 10, 20, 30, 40, 50 are realized by means of a coil 62, which also has three winding taps in addition to the two terminals of the coil. The further coupling impedance 26 of the further transistor 20 is obtained by the partial coil 63, the impedance of which is lower than the impedance of the coil 62. The transistor 30 has the partial coil 64 as coupling impedance 36 and the transistor 40 has a partial coil 65 as coupling impedance 46, the coil 62 having the largest inductance value and the partial coil 65 having the smallest inductance value.

By selecting the transistor 10, 20, 30, 40, 50 which is intended to amplify the signal $U_{IN}$ to be amplified, it is possible to realize different gain factors for the signal $U_{IN}$ to be amplified. This is done by selecting a transistor 10, 20, 30, 40, 50 with suitable current negative feedback, which is obtained as in this case by the coil 62 or partial coils 63, 64, 65.

FIGS. 6 A to D show simulation results of an example amplifier arrangement in accordance with FIG. 4. Here the amplifier arrangement is used as an input stage of a power amplifier for changing over a small-signal gain. The power amplifier serves for amplifying signals $U_{IN}$ to be amplified which have a frequency of approximately 900 MHz. The frequency 900 MHz serves only as an example.

The amplifier arrangement can be used both for frequencies which are significantly lower than 900 MHz and at frequencies which are significantly higher than 900 MHz.

FIG. 6 A shows a periodic noise response, abbreviated to PNA, and FIG. 6 B shows an output power $P_{OUT}$ and also a power amplifier efficiency, abbreviated to PAE, in the case of a high gain factor, which in both figures are plotted against the input power $P_{IN}$ present at the input terminal 9.

FIGS. 6 C and D, by contrast, show the same quantities, the values being determined in the case of an activated reduction of the gain factor by approximately 10 dB compared with FIGS. 6 A and 6 B. The inductance of the first coupling impedance 16 is chosen to be lower than the inductance of the further coupling impedance 26 in the simulation for the determination of the dependencies.

The maximum of the noise response is smaller approximately by 7 dB in FIG. 6 C compared with FIG. 6 A, which signifies an improvement. In addition, the output power $P_{OUT}$ is linear for the entire range of the input power $P_{IN}$ and no longer attains saturation.

FIG. 7 shows a further example embodiment of a coil (62) such as may be used in the amplifier arrangements. The coil (62) comprises a first, a second and a third partial coil (70, 71, 72). The first partial coil (70) has its own coil former and comprises a first terminal connected to the second terminal (12) of the first transistor (10), and a second terminal. The second partial coil (71) has its own coil former and comprises a first terminal connected to the second terminal of the first partial coil (70) and to the second terminal (22) of the second transistor (20) and also a second terminal. The third partial coil (72) likewise has its own coil former and comprises a first terminal connected to the second terminal of the second partial coil (71) and to the second terminal (32) of the third transistor (30), and a second terminal connected to the first supply voltage terminal (2).

In one embodiment, the amplifier arrangement has at least two transistors. Each of these transistors has a first, a second and a third terminal. The second terminal of the first transistor is coupled to the first supply voltage terminal of the amplifier arrangement by means of the first coupling impedance. The second terminal of the second transistor and of all further transistors that are present, if appropriate, is analogously coupled to the first supply voltage terminal via the further or the plurality of further coupling impedances. In one embodiment, the coupling impedances of the transistors have different inductance values.

The amplifier arrangement has the input terminal, which is in each case coupled to the first terminal of the respective transistor. Said input terminal serves for feeding an AC voltage signal to be amplified to the amplifier arrangement.

In one embodiment, the amplifier arrangement has a common output node coupled to the second supply voltage terminal of the amplifier arrangement and in each case to the third terminal of the respective transistor and also the output terminal of the amplifier arrangement for outputting the amplified signal.

The amplifier arrangement furthermore comprises the means for activation/deactivation of the transistors, which, on the input side, has at least one selection input for feeding in at least one control signal and, on the output side, is in each case coupled to the first terminal of the respective transistor. The means for activation/deactivation is designed for driving the first and the at least one further transistor in a manner dependent on the at least one control signal.

By means of the different coupling impedances with which the second terminals of the transistors are coupled to the first supply voltage terminal, different gain factors are achieved at the different transistors.

Depending on the overall gain of the amplifier arrangement that is to be set, the respective transistors can be set into an active operating state or into a deactivated operating state by the means for activation/deactivation. The individual transistors can be switched on or off by the means for deactivation/activation.

This arrangement permits exclusively employing transistors of one integration technology. One integration technology means a method for producing bipolar transistors or a method for producing MOS transistors. Additionally, individual branches of this amplifier arrangement can be optimized separately for the different gain factors to be set. Since the overall gain factor can be altered by turning the transistors on and off, the gain factor can be realized by means of a design of the coupling impedances to which the first and the at least one further transistor are connected up.

The amplifier arrangement can realize the load impedance as a common load impedance, because this results in a reduced component or area requirement on a semiconductor body in contrast to a realization of the load impedance as individual transistor load impedances.

In one embodiment, the mechanism for activation/deactivation is designed such that in each case precisely one individual transistor is activated and, consequently, in each case all the other transistors are deactivated.

In one embodiment, the coupling impedances each comprise an impedance having a higher impedance value in the frequency range of the signal to be amplified compared with the impedance values at lower frequencies.

In one embodiment, the different coupling impedances may be realized as in each case an individual impedance. In one development, the impedances may in each case be realized by being an impedance from a common impedance network.

In one embodiment, the first coupling impedance may comprise a coil having a first and a second terminal and also at least one tap. The tap may also be referred to as a winding tap since a winding of the coil is electrically accessible externally at the tap by means of a conductive connection. The first transistor may thus be connected to the first terminal of the coil at its second terminal.

The coil may be coupled to the first supply voltage terminal at the second terminal. The at least one further transistor may be connected to the at least one tap of the coil at its second terminal. The further coupling impedance may thus be an impedance between the at least one tap of the coil and the second terminal of the coil. Consequently, with one coil it is possible to realize different coupling impedances and hence different gain factors.

A tap may also be referred to as a center tap. A center tap may, but need not, lie in the center of the coil. Center tap in this case denotes any tap between the first and second ends of the coil.

Since, in one example, only one transistor is switched on and all further transistors are switched off, an undesirable interaction between the different amplifier stages connected in parallel does not occur even in the case of common coil portions.

In one development, the means for activation/deactivation is designed to pass a BIAS potential to the respective first terminal of the respective transistor in order to shift the transistor into an active operating state or into an inactive operating state.

In one embodiment, the means for activation/deactivation may comprise a first and at least one further selection impedance, which connects a first and at least one further selection input of the amplifier arrangement to the first terminal of the first transistor and of the at least one further transistor, respectively.

In one embodiment, the selection impedance and the at least one further selection impedance may be designed as resistances. In one embodiment, the selection impedances have higher impedance values in the frequency range of the signal to be amplified compared with impedance values at lower frequencies. This embodiment has the bias potential, which generally has a constant value, being connected to the first terminal of the transistor by means of a selection impedance with a resistance value that is low at low frequencies. A selection impedance which has a high resistance value in the frequency range of the signal to be amplified has the effect that crosstalk between the signal to be amplified and the voltage source that provides the bias potential is low. In one embodiment, the selection impedance and the at least one further selection impedance may be realized as inductances. A lower noise of inductances compared with resistances as selection impedances can be obtained.

In one embodiment, the selection impedances may be constructed identically. In one development, the selection impedances have different impedance values in order to enable the individual transistors to have different operating points.

In one embodiment, a bias potential present at the respective selection inputs for activation may be of the same magnitude in each case. In one development, the potentials at the selection inputs in the case of activation are of different magnitudes.

The gain factor of the transistors can thereby be set differently by the different selection impedances and of the bias potentials of different magnitudes. This setting possibility may be chosen in addition to the different design of the coupling impedances between the second terminals of the transistors and the first supply voltage terminal in order to realize different gain factors of the transistors.

In one embodiment, the means for activation/deactivation comprises input impedances which connect the input terminal of the amplifier arrangement to the respective first terminal of the respective transistor.

In one embodiment, the input impedances may have lower impedance values in the range of the frequencies of the signal to be amplified compared with impedance values at lower frequencies in order that the signal to be amplified is attenuated only to a small extent by the input impedance. The high impedance value at low frequencies serves for decoupling the input terminal from the bias potentials which are present at the selection inputs. This prevents the amplifier arrangement from applying a DC voltage potential to the input terminal of the amplifier arrangement.

In one embodiment, the transistors of the amplifier arrangement may be formed as pnp bipolar transistors. The respective base of a transistor forms the first terminal of this transistor. If, in one embodiment, the potential of the first supply voltage terminal is higher than the potential of the second supply voltage terminal, then the emitters of the transistors may form the respective second terminals of the transistors and the collectors of the transistors may form the respective third terminals of the transistors. If, in another embodiment, the potential of the first supply voltage terminal is lower than the potential of the second supply voltage terminal, then the collectors may form the respective second terminals of the transistors and the emitters may form the respective third terminals of the transistors. In the last embodiment, the first supply voltage terminal may be able to be connected to a reference potential and the second supply voltage terminal may be able to be connected to a supply voltage $V_{CC}$.

In an alternative development, the transistors are realized as npn bipolar transistors. If the potential of the first supply voltage terminal is higher than the potential of the second supply voltage terminal, the collectors may form the respective second terminals of the transistors and the emitters may form the respective third terminals of the transistors. If the potential of the first supply voltage terminal is lower than the potential of the second supply voltage terminal, in one example, the emitters may form the respective second terminals of the transistors and the collectors may form the respective third terminals of the transistors. One advantage of the npn bipolar transistors over the pnp bipolar transistors resides in the greater current driver capability of the npn bipolar transistors for the same geometry data.

In an alternative embodiment, the amplifier arrangement may have pnp bipolar transistors. In an alternative embodiment, it may comprise npn bipolar transistors. It may comprise both at least one npn bipolar transistor and at least one pnp bipolar transistor.

At least one bipolar transistor may be realized as a bipolar junction transistor, abbreviated to BJT, or as a heterojunction bipolar transistor, abbreviated to HBT.

In one embodiment, at least one transistor of the amplifier arrangement may be realized as a field effect transistor. One embodiment of a field effect transistor may be a high mobility transistor, abbreviated to HEMT, or a junction field effect transistor or a metal semiconductor field effect transistor, abbreviated to MESFET, or a laterally diffused metal oxide semiconductor field effect transistor, abbreviated to LDMOSFET. In one example, a field effect transistor is a metal oxide semiconductor field effect transistor, abbreviated to MOSFET.

In one embodiment, the respective third terminals of the transistors may be connected to the output node by means of a respective transistor load impedance. The transistor load impedance may comprise for example a resistance of the line between the third output of the respective transistor and the output node.

In one embodiment, a load impedance may connect the common output node to the second supply voltage terminal. In one development, the load impedance may be designed such that it has higher impedance values in the range of the frequencies of the signal to be amplified compared with impedance values at lower frequencies. This avoids a reduction of the amplitude of the amplified signal at the output node. In one embodiment, the load impedance may comprise an inductance.

In one embodiment, an output terminal impedance may connect the output node to the output terminal. In one development, the output terminal impedance may be designed such that it has lower impedance values in the range of the frequencies of the signal to be amplified compared with impedance values at lower frequencies. In an example embodiment, the output terminal impedance may comprise a capacitor.

A method for amplifying a signal to be amplified with a gain factor that can be changed over, comprises the following:
feeding in a signal to be amplified;
feeding in at least one control signal for predefining the gain factor from a set comprising a first and at least one further gain factor;
optionally amplifying the signal to be amplified with the first gain factor by means of a first transistor whilst utilizing a negative feedback with a first coupling impedance;
optionally amplifying the signal to be amplified with the at least one further gain factor by means of at least one further transistor whilst utilizing a negative feedback with at least one further coupling impedance with an inductive component, the inductance value of which differs from the inductance value of the first coupling impedance, and the first and the further coupling impedance comprise a common partial inductance;
providing an amplified signal.

The method thus comprises the following:
A signal to be amplified and at least one control signal are fed in.

The control signal is taken as a basis for selecting which transistors are used for amplifying the signal to be amplified. The transistors have different gain factors. These different gain factors are a result of the different coupling impedances of the transistors. The coupling impedances serve for setting the negative feedback of the respective transistors.

Consequently, a signal to be amplified is amplified with a chosen gain factor and provided.

The transistor can be activated which has the gain factor selected for the amplification of the signal to be amplified by means of the control signal.

In another development, in each case precisely one transistor is activated and all further transistors are deactivated.

In one embodiment, the negative feedback may be a voltage negative feedback. In a another embodiment, the negative feedback may be formed as a current negative feedback.

For activating a transistor, in one embodiment, a bias potential is applied to the first terminal of said transistor, the magnitude of which is designed to shift a transistor into an active operating state. The transistors that are not to be activated have applied at their first terminal a bias potential which deactivates said transistors.

The method can include providing a supply voltage which is applied to the arrangement between a first supply voltage terminal and a second supply voltage terminal. The supply voltage may be dropped across the load impedance and a series circuit comprising the transistor and the coupling impedance. The voltage at the series circuit may be dropped between the second and third terminals of the transistor and across the coupling impedance. At least one further series circuit comprising the at least one further transistor and the at least one further coupling impedance may be connected in parallel with a series circuit comprising the first transistor and the first coupling impedance.

The signal to be amplified may be applied to an input terminal of the amplifier arrangement. The signal to be amplified may be fed to the first terminal of the activated transistor. Since, in one embodiment, a coupling component may be situated between the input terminal of the amplifier arrangement and the first terminal and an AC voltage behavior of the coupling component, of the transistor and also of the selection impedance is to be taken into account, a voltage at the first terminal may be altered relative to the voltage of the signal to be amplified at the input terminal.

After the amplification by the activated transistor, the amplified signal may be tapped off at an output terminal of the amplifier arrangement. In one embodiment, said output terminal may be coupled to an output node situated between the load impedance and the series circuit.

In one development, the operating point of the respective transistor is defined at least by a bias potential present at a selection input to which the respective transistor is coupled, and by a selection impedance situated between the selection input and the first terminal of the respective transistor, and also by the supply voltage, the load impedance and the coupling impedance.

In one embodiment, the gain factor obtained by means of a transistor can thus be set by the design of its coupling impedance and of its selection impedance and also by the bias potential present at its selection input.

In one embodiment, a high efficiency in energy utilization can be obtained by virtue of the fact that, for the respective operating mode of the overall arrangement, it is possible to select that transistor which brings about the gain factor intended for said operating mode.

With inductances as coupling impedances, in one embodiment, the gain can be choked very effectively and frequency-selectively. A possible self-turn-on can be attenuated by the emitter coil.

In one embodiment, a low-noise amplification can be achieved with the arrangement since coupling impedances formed from coils or parts of coils have only low resistances. The noise behavior of inductive coupling elements is significantly better than that of resistive coupling elements. It can be changed over without disadvantages in terms of the noise behavior.

In one embodiment, the circuit arrangement may achieve a stabilization of the transistor stage in the case of an oscillator tendency.

In one embodiment, the use of a coil with a plurality of taps enables the coupling impedances to be realized in an area-saving and cost-efficient manner. The desired gain can be set by the inductance value, it being possible to set the ratio of the gain by the choice of the position of the tap. The position may also be chosen in asymmetric fashion, that is to say not be situated in the center of the coil.

In one embodiment, the input impedances, the selection impedances, the output impedance and the load impedance may be optimized such that crosstalk between the radio frequency signal and the DC voltage potentials and likewise crosstalk between the DC voltage potentials and the inputs and the output of the amplifier arrangement can be set to be very small.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. The term "exemplary" is intended to indicate an example and not a best or superior solution or implementation. Furthermore, to the extent that the terms "including", "includes", "having", "has", "with", or variants thereof are used in either the detailed description and the claims, such terms are intended to be inclusive in a manner similar to the term "comprising."

What is claimed is:

1. An amplifier arrangement comprising:
   a first transistor comprising a first terminal, a second terminal, and a third terminal;
   a further transistor comprising a first terminal, a second terminal, and a third terminal;
   a first coupling impedance comprising a coil and that couples a first supply terminal to the second terminal of the first transistor;
   a further coupling impedance comprising a partial coil and that couples the first supply terminal to the second terminal of the further transistor;
   an input terminal coupled to the first terminal of the first transistor and the first terminal of the further transistor;
   a common output node coupled to a second supply voltage terminal, an output terminal, the third terminal of the first transistor, and the third terminal of the further transistor; and
   an activation/deactivation mechanism comprising at least one selection input, wherein the activation/deactivation mechanism is coupled to the first terminal of the first transistor and the first terminal of the further transistor, wherein the coil of the first coupling impedance comprises at least one winding tap connected to the second terminal of the further transistor.

2. The amplifier arrangement of claim 1, wherein the at least one selection input receives at least one control signal and wherein the activation/deactivation mechanism controls the first transistor and the further transistor according to the at least one control signal.

3. The amplifier arrangement of claim 1, wherein the activation/deactivation mechanism activates one of the first transistor and the further transistor and deactivates the other of the first transistor and the further transistor.

4. The amplifier arrangement of claim 1, wherein the first coupling impedance and the further coupling impedance have higher impedance values for a selected range of frequencies of an input signal applied to the input terminal and have lower impedance values otherwise.

5. The amplifier arrangement of claim 1, wherein the first coupling impedance and the further coupling impedance comprise an impedance from a common impedance network.

6. The amplifier arrangement of claim 1, wherein the activation/deactivation mechanism outputs an activation bias potential to one of the first transistor and the further transistor and generates a deactivation bias potential to the other of the first transistor and the further transistor.

7. The amplifier arrangement of claim 1, wherein the activation/deactivation mechanism comprises a first selection impedance that connects a first selection input to the first terminal of the first transistor and a further selection impedance that connects a further selection input to the first terminal of the further transistor.

8. The amplifier arrangement of claim 7, wherein the first selection impedance has a first impedance value defining an operating point of the first transistor, wherein the further selection impedance has a further impedance value defining an operating point of the further transistor, and wherein the first impedance value that the further impedance value are varied.

9. The amplifier arrangement of claim 7, wherein the first selection input and the further selection input have varied potentials applied that define the operating point of the first transistor and the further transistor.

10. The amplifier arrangement of claim 1, wherein the activation/deactivation mechanism comprises a first input impedance that connects the input terminal to the first terminal of the first transistor and a further input impedance that connects the input terminal to the first terminal of the further transistor.

11. The amplifier arrangement of claim 1, further comprising a load impedance that connects the common output node to the second supply voltage terminal.

12. The amplifier arrangement of claim 1, further comprising an output terminal impedance that connects the common output node to the output terminal.

13. An amplifier arrangement comprising:
a first transistor;
at least one further transistor;
a first coupling impedance comprising a coil and that couples a first supply voltage terminal to a terminal of the first transistor;
at least one further coupling impedance that couples the first supply voltage terminal to respective terminals of the at least one further transistor;
an input terminal coupled to input sides of the first transistor and the at least one further transistor;
a second supply voltage terminal coupled to output side terminals of the first transistor and the at least one further transistor; and
an output terminal coupled to the output side terminals,
wherein the coil comprises a first terminal connected to the terminal of the first transistor and a second terminal connected to the first supply voltage terminal, and at least one winding tap connected to a terminal of the at least one further transistor.

14. The amplifier arrangement of claim 13, wherein the coil comprises a first partial coil comprising a first terminal connected to the terminal of the first transistor.

15. The amplifier arrangement of claim 13, wherein a ratio of gain applied to an input signal applied to the input terminal to an amplified signal generated at the output terminal is dependent upon a position of the at least one winding tap.

16. The amplifier arrangement of claim 13, wherein one of the at least one winding tap is arranged at a center of the coil.

17. The amplifier arrangement of claim 13, further comprising a first selection impedance that connects a first selection input to the input side terminal of the first transistor that receives a first control signal and at least one further selection impedance that connect at least one further selection input to the input side terminals of the at least one further transistor.

18. A power amplifier comprising:
a first amplifier comprising a first transistor;
at least one further amplifier comprising at least one further transistor;
wherein the first amplifier and the at least one further amplifier comprise input sides, output sides, and supply sides;
a coupling-in element that receives a signal to be amplified and is coupled to the input sides;
an activation/deactivation unit coupled to the coupling-in element;
a coupler comprising a series circuit formed by a first inductance and at least one further inductance, wherein the coupler connects the supply sides to a first supply voltage terminal; and
a coupling-out element for providing an amplified signal connected to the output sides,
wherein the series circuit is connected to the first transistor at a first terminal, to a first supply voltage terminal at a second terminal, and to the at least one further transistor at a tap between the first and the at least one further inductance.

19. The power amplifier of claim 18, wherein the coupling-in element comprises a first and at least one further impedance.

20. The power amplifier of claim 18, wherein the activation/deactivation unit comprises a first selection impedance and at least one further selection impedance.

21. The power amplifier of claim 18, wherein the first inductance and the at least one further inductance comprise partial coils of a coil.

22. The power amplifier of claim 18, wherein the coupling-out element comprises an output terminal impedance that couples a common output node of the first transistor and the at least one further transistor at which the amplified signal can be tapped off.

23. The use of the amplifier arrangement as claimed in claim 18 as a radio frequency amplifier in a mobile phone.

* * * * *